(12) United States Patent
Yamagata

(10) Patent No.: US 6,451,719 B1
(45) Date of Patent: Sep. 17, 2002

(54) SILICA GLASS OPTICAL MATERIAL FOR EXCIMER LASER AND EXCIMER LAMP, AND METHOD FOR PRODUCING THE SAME

(75) Inventor: Shigeru Yamagata, Narashino (JP)

(73) Assignees: Heraeus Quarzglas GmbH & Co. KG, Hanau (DE); Shin-Etsu Quartz Products Co., Ltd., Tokyo (JP)

( * ) Notice: Subject to any disclaimer, the term of this patent is extended or adjusted under 35 U.S.C. 154(b) by 31 days.

(21) Appl. No.: 09/692,014

(22) Filed: Oct. 19, 2000

(30) Foreign Application Priority Data

Oct. 19, 1999 (JP) ............................................. 11-296101

(51) Int. Cl.$^7$ ................................................. C03C 3/06
(52) U.S. Cl. ........................................ 501/54; 501/905
(58) Field of Search ................................... 501/54, 905

(56) References Cited

U.S. PATENT DOCUMENTS

| | | | |
|---|---|---|---|
| 2,904,713 A | | 9/1959 | Heraeus et al. |
| 3,128,166 A | | 4/1964 | Mohn |
| 3,128,169 A | | 4/1964 | Heraeus et al. |
| 3,483,613 A | | 12/1969 | Malcolm et al. |
| 5,326,729 A | * | 7/1994 | Yaba et al. |
| 5,679,125 A | * | 10/1997 | Hiraiwa et al. |
| 5,958,809 A | * | 9/1999 | Fujiwara et al. ............... 501/54 |
| 6,242,136 B1 | * | 6/2001 | Moore et al. |

FOREIGN PATENT DOCUMENTS

| | | |
|---|---|---|
| EP | 1043282 A | * 10/2000 |
| JP | 48734 | of 1994 |

OTHER PUBLICATIONS

Document No. 227827, 1994, Japan Patent Application Laid–open.
Document No. 48734/1994, Japan Pat Publication.
Dodd, et al, "Optical determination of OH in fused silica, " Journal of Applied Physics, vol. 37 (1966) p. 3911.
Khotimchenko, et al; "Determining the content of hydrogen dissolved in quartz glass . . . ," Journal of Applied Spectroscopy, vol. 46, No. 6 ('87) pp 632–635.
Hosono, et al; "Experimental evidence for the IS–IS bond model . . . ," Physical Review B, vol. 44, No. 21 (1991) pp 12043–12045.

* cited by examiner

*Primary Examiner*—David Sample
(74) *Attorney, Agent, or Firm*—Milde & Hoffberg LLP

(57) ABSTRACT

A silica glass optical material for transmitting light with a wavelength of from 155 to 195 nm emitted from an excimer laser or an excimer lamp, which comprises silica glass optical material of ultrahigh purity, containing from 1 to 100 wtppm of OH groups, from $5\times10^{16}$ to $5\times10^{19}$ molecules/cm$^3$ of $H_2$, and from 10 to 10,000 wtppm of F, but substantially free from halogens other than F, and having a fluctuation in refractive index, $\Delta n$, of from $3\times10^{-6}$ to $3\times10^{-7}$.

37 Claims, No Drawings

SILICA GLASS OPTICAL MATERIAL FOR EXCIMER LASER AND EXCIMER LAMP, AND METHOD FOR PRODUCING THE SAME

FIELD OF APPLICATION

The present invention relates to a silica glass optical material and a method for producing the same; in particular, it relates to a silica glass optical material for radiation with a wavelength of 155 to 195 nm using an excimer laser or an excimer lamp as the light source, and to a method for producing the silica glass optical material.

PRIOR ART

The silica glass optical material described above is used as lenses, prisms, windows, reflectors, photomasks, tubes, etc., that are embedded in a light irradiating device for photo-cleaning, aligners for producing integrated circuits (photolithographic devices), etc., using an excimer laser device or an excimer lamp which emits light with a wavelength of from 155 to 195 nm.

Conventionally, for producing patterns of integrated circuits on a silicon wafer, ultraviolet radiation using mercury vapor lamp, such as g-line and i-line, has been used as the light source for a photolithographic device. However, as the semiconductor devices become finer, the aforementioned g-line and i-line found limits in resolution. Accordingly, excimer lasers which emit radiation with shorter wavelength attracted attention, and a photolithographic device using KrF excimer laser (248 nm) has been developed and put into practice.

However, a higher degree of integration of the semiconductor devices is expected in the near future, and this requires a light source capable of producing fine patterns with a line width of 0.1 $\mu$m or still finer.

As the light sources meeting the requirements above, there can be mentioned high power output vacuum ultraviolet radiators emitting a wavelength of from 155 to 195 nm. Thus, efforts are devoted mainly to the development of an ArF excimer laser (193 nm), and next to that of an ArCl excimer laser (175 nm), an $F_2$ excimer laser (157 nm), etc. However, because the high power output vacuum ultraviolet radiation is far higher in power compared to the ultraviolet radiation used conventionally in photolithographic devices, the optical materials subjected to the irradiation may suffer abrupt damage such as a drop in transmittance, an increase in refractive index, a generation of strain, a generation of fluorescence, occasional generation of micro-cracks, etc., thereby making the material practically unfeasible.

In addition to the above, dry cleaning using a high power output ultraviolet radiation with a wavelength of from 155 to 195 nm, such as an ArF excimer laser (193 nm), an $F_2$ excimer laser (157 nm), an $Xe_2$ excimer lamp (172 nm), an ArCl excimer lamp (175 nm), etc., is being developed as a method for cleaning semiconductor devices. However, devices for the cleaning treatment require a large optical material for use as the windows and tubes. However, if the optical material becomes larger in size, it tends to suffer greater damage by the high output vacuum ultraviolet radiation, and it no longer serves as an optical material.

In the light of such circumstances, the development of an optical material that suffers less damage by the irradiation with the aforementioned high power output vacuum ultraviolet radiation emitted by an excimer laser or an excimer lamp has been keenly demanded.

As a material that satisfies the aforementioned requirements, there is known a material disclosed in Japanese Patent Laid-Open No. 227827/1994. More specifically, the optical material disclosed in the publication above is a transparent quartz glass produced by heating a porous quartz glass body formed by depositing fine quartz glass particles obtained by flame hydrolysis and growing it, characterized in that the transparent quartz glass contains 10 ppm or less of OH, 400 ppm or more of a halogen, and that it contains hydrogen.

In Japanese Patent Publication No. 48734/1994 an optical material for laser radiation is proposed, having a gaseous hydrogen concentration of at least $5 \times 10^{16}$ (molecules/$cm^3$) or higher and an OH group concentration of 100 wtppm or higher. Further, in Japanese Patent Publication No. 27013/1994 a synthetic silica glass optical body is proposed having a hydrogen gas concentration of at least $5 \times 10^{16}$ (molecules/$cm^3$) or higher, an OH group concentration of 50 wtppm or higher, and substantially free from distribution in fluctuation of refractive index by canceling out the distribution in fluctuation of refractive index based on the concentration distribution of OH groups by the distribution in fluctuation of refractive index based on the virtual temperature.

However, if the optical material is used in a large optical device, for instance, in an optical device exceeding a size of 200 mm in diameter and 30 mm in thickness, non-uniform distribution likely occurs in the concentration of hydrogen molecules, OH Ad groups, and halogen, and this leads to inferior optical characteristics ascribed to the change in transmittance and refractive index under irradiation with excimer laser or excimer lamp. If OH groups should be contained in the silica glass optical material in such a high concentration as 100 wtppm or higher, the durability becomes inferior due to a drop in the initial transmittance in the vacuum ultraviolet region. That is, the optical material proposed in the above patent publication suffered problems of low initial transmittance in the wavelength region of from 1 55 to 195 nm and of insufficient durability. The optical material disclosed in Japanese Patent Laid-Open No. 227827/1994 utilizes halogens, however, among the halogens, Cl and the like are apt to generate defects upon irradiation of an ultraviolet radiation, and it suffered a serious problem of deteriorating the performance of the optical material such as transmittance in the targeted spectral region.

SUMMARY OF THE INVENTION

In the light of such circumstances, it has been found that there can be obtained a synthetic silica glass optical material excellent in durability to long irradiation with an excimer laser or excimer lamp and having high transmittance and a small fluctuation in refractive index, $\Delta n$, by increasing the purity of the optical material higher than that disclosed in the published patent application above while controlling the concentration of the OH groups and the hydrogen molecules in a certain range, and by making the concentration distribution thereof uniform while particularly selecting Fluorine among the halogens and controlling the concentration thereof to a specified range smaller than that employed in a conventional technology. Furthermore, by limiting the concentration of the OH groups and the hydrogen molecules within the synthetic silica glass optical material in a range narrower than that described above, it has been found that the material can yield a higher initial transmittance, particularly, with respect to an excimer laser radiation in the wavelength region of from 155 to 195 nm, and that the durability can be maintained at a high level. The present invention has been accomplished based on these findings.

That is, an object of the present invention is to provide a silica glass optical material having a high initial transmittance with respect to excimer lasers and excimer lamps emitting radiation in a wavelength region of from 155 to 195 nm and a small fluctuation in refractive index, yet having excellent durability when subjected to an irradiation for a long duration of time.

The problems above can be solved by one of the embodiments described in (1) to (13) below.

(1) A silica glass optical material for transmitting light with a wavelength of from 155 to 195 nm emitted from an excimer laser or an excimer lamp, wherein said silica glass optical material is of ultrahigh purity, contains from 1 to 1 00 wtppm of OH groups, from $5 \times 10^{16}$ to $5 \times 10^{19}$ molecules/cm$^3$ of $H_2$, and from 10 to 10,000 wtppm of F, but is substantially free from halogens other than F, and has a fluctuation in refractive index, $\Delta n$, of from $3 \times 10^{-6}$ to $3 \times 10^{-7}$.

(2) A silica glass optical material of (1) above, wherein the fluctuation in OH-group concentration, $\Delta OH$, is 30 wtppm or less.

(3) A silica glass optical material of (1) or (2) above, wherein the fluctuation in $H_2$ concentration, $\Delta H_2$, is $3 \times 10^{17}$ molecules/cm$^3$ or less.

(4) A silica glass optical material described in one of (1) to (3), wherein the material contains from 12 to 100 wtppm of OH groups and from $3 \times 10^{17}$ to $1 \times 10^{19}$ molecules/cm$^3$ of $H_2$.

(5) A silica glass optical material described in any of (1) to (4), wherein the material contains from 10 to 380 wtppm of F.

(6) A silica glass optical material described in any of (1) to (5), wherein the material is of ultrahigh purity containing, as impurities, 5 wtppb or less of each of Li, Na, and K, 1 wtppb or less of each of Ca and Mg, and 0.1 wtppb of each of Cr, Fe, Ni, Mo, and W.

(7) A silica glass optical material described in any of (1) to (6), wherein the concentration of oxygen-deficient type defects which generate an absorption band at 7.6 eV is $1 \times 10^{17}$ defects/cm$^3$ or less.

(8) A silica glass optical material described in any of (1) to (7), wherein the material contains 10 wtppm or less of Cl.

(9) A silica glass optical material described in any of (1) to (8), wherein the material is used for an optical device having an optical path length from an excimer laser or an excimer lamp of 30 mm or longer.

(10) A silica glass optical material for transmitting light with a wavelength of from 155 to 195 nm emitted from an excimer laser or an excimer lamp, characterized in that said silica glass optical material is of ultrahigh purity, contains from 1 to 100 wtppm of OH groups, from $5 \times 10^{16}$ to $5 \times 10^{19}$ molecules/cm$^3$ of $H_2$, and from 10 to 10,000 wtppm of F, but is substantially free from halogens other than F, and satisfies a relation that the sum of a and b is 100 wtppm or higher and that the ratio b/a is in the range of from 1 to 1000, wherein a and b each represent the content of OH groups and that of F, respectively.

(11) A silica glass optical material of (10), wherein the ratio b/a is in the range of from 10 to 100.

(12) A method for producing a silica glass optical material, which comprises producing a white colored soot body containing OH groups by means of flame hydrolysis of a silicon compound, performing fluorine doping treatment to the resulting soot body by heat treatment in a fluorine-containing gaseous atmosphere to obtain a white soot body containing OH groups and fluorine, vitrifying the resulting body to obtain a transparent body, obtaining a rod-like transparent silica glass body by flame heat molding, applying to the resulting body zone melting rotary stirring treatment by flame heating to thereby homogenize the distribution of concentration of OH groups and fluorine, removing strain by annealing treatment, and finally performing gaseous hydrogen doping by applying heat treatment in a gaseous atmosphere containing hydrogen molecules.

(13) A method for producing a silica glass optical material of (12), wherein the annealing treatment is performed in a gaseous atmosphere containing hydrogen molecules, thereby performing simultaneously the annealing treatment and the hydrogen gas doping treatment.

PREFERRED EMBODIMENT OF THE INVENTION

In the present invention, further improvements in resistance against excimer laser radiation and in resistance against excimer lamp radiation, as well as in precision in processing using excimer laser or excimer lamp, were achieved by optimizing the combination of the five characteristics of the material, i.e., ultra-high purity, content of OH groups, content of fluorine (F), dissolved gaseous hydrogen, and the fluctuation of refractive index, $\Delta n$.

The reasons for the necessity of controlling the combination of the five characteristics above are as follows.

Concerning ultra-high purity, increased transmittance and reduced energy absorption in the vacuum ultraviolet region can be achieved by reducing the concentration of metallic impurities in the silica glass. It is required that the concentrations of Li, Na, and K are each 5 wtppb or lower, that those of Ca and Mg are each 1 wtppb or lower, and that those of Cr, Fe, Ni, Mo, and W are each 0.1 wtppb or lower. Li, Na, K, Ca, and Mg are contained as impurities of various types of heat-resistant ceramics, and they tend to function as contaminating elements in case of producing silica glass. Cr, Fe, Ni, Mo, and W are the components of the structural material used in plants. In particular, Mo and W are used as heat-resistant metals, and they also tend to function as contaminants.

The OH groups are the terminal ends of the network structure of glass; by adding them in a proper amount, the structure can be relaxed and the Si—O—Si bonding angle can be brought close to a stable value. However, if OH groups should be incorporated in a high concentration, they lead to a drop in transmittance in the vacuum ultraviolet region. Thus, Oh groups should be incorporated in a concentration range of from 1 to 100 wtppm, and in particular, in case of a material for excimer lasers irradiating radiation from 155 to 195 nm in wavelength, which is used under severe conditions of high irradiation energy density per unit area, the concentration thereof is preferably in the range of from 12 to 100 wtppm.

Similar to OH groups, F also forms the terminal ends of the network structure of lass. Furthermore, unlike other halogen elements, F, although incorporated at a high concentration, does not cause deterioration in transmittance in the vacuum ultraviolet region. However, if F alone is incorporated at a high concentration in the absence of OH groups, glass undergoes decomposition during the heat treatment, and generates gaseous $F_2$ or absorption band at 7.6 eV (ca. 165 nm) ascribed to the generation of oxygen deficient defects. Accordingly, the key is to incorporate F and OH groups at the same time to suppress the thermal decomposition of glass and the generation of oxygen deficient defects.

From this point of view, it is preferred that the values a and b, where a represents the content of OH groups and b represents the content of F, satisfy the relation as such that a and b in total is 100 wtppm or higher. and that the ratio b/a is in the range of from 1 to 1000. In particular, the ratio b/a preferably is in the range of from 10 to 100. In this case, it is preferred that the concentration of OH groups is in the range of from 1 to 100 wtppm, particularly, 12 to 100 ppm, and that of F is in the range of from 50 to 10,000 wtppm, and particularly, 50 to 380 wtppm.

In the optical material according to the present invention, it is preferred that it does not substantially contain halogens other than F. Because Cl generates a drop in transmittance of glass in the vacuum ultraviolet region (i.e., the wavelength region of excimer laser radiation), it is preferred that the content thereof is 10 wtppm or lower.

A The dissolved gaseous hydrogen, i.e., the hydrogen molecules $H_2$ incorporated inside the optical material, suppresses the generation of an E' center (denoted as "E prime center", and yields an absorption band at about 215 nm) or a NBOH center (denoted as "Non-Bridging Oxygen Hole center", and yields absorption bands at about 260 nm and about 360 nm)(for reference, see S. Yamagata, Mineralogical Journal, Vol. 15, No. 8 (1991), pp. 333–342), and the content thereof is preferably in the range of from $5 \times 10^{16}$ to $5 \times 10^{19}$ molecules/cm$^3$, and particularly preferably, in the range of from $3 \times 10^{17}$ to $1 \times 10^{19}$ molecules/cm$^3$.

In case the optical material is used so thin as such corresponding to a thickness of a photomask as disclosed in the above Japanese Patent Laid-Open No. 227827/1994, that is, if the optical path for the laser radiation is so short as about 2 to 3 mm in length, there is no particular problem. However, in case of a product such as a lens used as an optical device having a thickness of 30 mm or more, the precision in processing using the product tends to become inferior if there is a large fluctuation in refractive index, $\Delta n$. Accordingly, $\Delta n$ is preferably minimized as possible. However, as described above, it has been newly found that, particularly in case F is doped at a high concentration, $\Delta n$ increases due to the distribution in concentration. Hence, in the optical material according to the present invention, the fluctuation in refractive index. $\Delta n$, was set at a small value in the range of from $3 \times 10^{-6}$ to $3 \times 10^{-7}$ by applying the treatment described later in the production method.

The fact that $\Delta n$ is set at such a low value signifies that the fluctuation in density of the material is also minimized. As a result, it enables dissolving gaseous hydrogen at a uniform concentration. A value for $\Delta n$ of $3 \times 10^{-6}$ or less requires that the material is free of striae in one direction. A glass having a high value of $\Delta n$ contains OH groups and F with a non-uniform distribution in concentration, and the concentration of saturated gaseous hydrogen is presumably influenced by the concentration of such OH groups and F.

From the facts above, the optical material according to the present invention preferably has a fluctuation in concentration of OH groups, $\Delta OH$, of 30 wtppm or less, and a fluctuation in concentration of F, $\Delta F$, of 50 wtppm or less. It is also preferred that the fluctuation in concentration of $H_2$, $\Delta H_2$, is $3 \times 10^{17}$ molecules/cm$^3$ or less. The concentration of oxygen deficient type defects which generate the 7.6 eV absorption band is preferably not higher than $1 \times 10^{17}$ defects/cm$^3$.

The method for producing the silica glass optical material above according to the present invention is described below.

To produce a silica glass optical material according to the present invention, a white soot body containing OH groups is synthesized by means of flame hydrolysis using a silicon compound as the starting material.

As the silicon compound above, there can be used, for instance, $SiCl_4$, $SiHCl_3$, $SiH_2Cl_2$, $SiCH_3Cl_3$, $Si(CH_3)_2Cl_2$, $SiF_4$, $SiHF_3$, $SiH_2F_2$, etc. As the flame, there can be used an oxyhydrogen flame, a propane oxygen flame, etc.

The white soot body containing OH groups is subjected to fluorine doping treatment by performing heat treatment in a fluorine-containing gaseous atmosphere.

As a gas containing fluorine, preferred is to use a gas containing from 0.1 to 100 vol. % of $SiF_4$, $CHF_3$, $SF_6$, etc. The treatment is preferably performed in the temperature range of from 400 to 1200° C., under a pressure of from 0,1 to 10 kgf/cm$^2$ (about 0,01 MPa to 1 MPa; exactly: 1 kgf/cm$^2$=0,0980665 MPa)

The resulting white soot body above is then subjected to vitrification treatment to obtain a transparent body. The treatment is preferably performed in an atmosphere (which may contain He) of reduced pressure of 0.1 kgf/cm$^2$ (about 0,01 MPa) or lower, in the temperature range of from 1400 to 1600° C.

Subsequently, the resulting body is molded into a rod-like transparent silica glass body using flame heating, and is subjected to a zone melting rotary stirring treatment. The treatments above can be performed by using the methods disclosed in, for example, U.S. Pat. No. 2,904,713, U.S. Pat. No. 3,128,166, U.S. Pat. No. 3,128,169, U.S. Pat. No. 3,483,613, etc. In particular, as described above, the treatments are thoroughly performed so that a fluctuation in refractive index, $\Delta n$, should fall in the range of from $3 \times 10^{-6}$ to $3 \times 10^{-7}$.

To remove strain, annealing treatment is applied to the resulting body. The treatment is generally carried out in the atmospheric air, and also usable are other types of inert gaseous atmospheres. The treatment is performed by holding the body at a temperature range of from 900 to 1200° C. for a duration of from 1 to 100 hours, and the temperature is gradually lowered to 500° C. or lower at a cooling rate of 1° C./hr to 10° C./hr.

Finally, doping treatment using gaseous hydrogen is performed by carrying out heat treatment in an atmosphere containing hydrogen molecules. As the atmosphere containing hydrogen molecules, it is preferred to use 100% gaseous hydrogen or a mixed gas atmosphere containing a rare gas such as Ar and gaseous hydrogen. Preferably, treatment is performed at a temperature of from 100 to 800° C., and particularly, from 200 to 400° C. If the treatment should be performed at a temperature higher than the range specified above, the reductive function becomes too intense as to generate oxygen deficient type defects. On the other hand, if the temperature should be lower than the range above, it takes too long a time for gaseous hydrogen to diffuse and dissolve into the transparent glass body.

Preferably, the treatment pressure is in the range of from about 1 kgf/cm$^2$ to 100 kgf/cm$^2$ (about 0,1 MPa to 10 MPa). Under an atmosphere of 100% gaseous hydrogen at a pressure of 1 kgf/cm$^2$, the saturation dissolution concentration of gaseous hydrogen into transparent glass body is in the range of from about $1 \times 10^{17}$ to $4 \times 10^{17}$ molecules/cm$^3$; under pressures of 10 kgf/cm$^2$ and 100 kgf/cm$^2$ (about 1 MPa to 10 MPa), the saturation dissolution concentration is $1 \times 10^{18}$ to $4 \times 10^{18}$ and $1 \times 10^{19}$ to $4 \times 10^{19}$ molecules/cm$^3$, respectively.

The material thus obtained is prepared intO a desired shape by grinding the outer surface.

EXAMPLES

A white-colored soot body containing OH groups was synthesized by oxyhydrogen flame hydrolysis using silicon tetrachloride SiCl4 as the starting material.

Then, the thus obtained white-colored soot body containing OH groups was subjected to fluorine doping treatment in a gaseous atmosphere containing 50% of $SiF_4$ under a pressure of 1 kgf/cm$^2$ (approximately the atmospheric pressure; about 0,1 MPa).) in the temperature range of from 700 to 1200° C. The concentrations of OH groups and F in the silica glass optical materials obtained in Examples and Comparative Examples were varied as shown in Table 1 and Table 2 by changing the temperature and the time duration of heat treatment.

Each of the white-colored soot bodies thus obtained were heated under vacuum (or an atmosphere of reduced pressure) not higher than 0.001 kgf/cm$^2$ (about 100 Pa) in the temperature range of from 1400 to 1600° C. to obtain a transparent glass body.

Then, the materials thus obtained were softened by flame heating using propane gas. Thus, rod-like materials having an approximately circular cross section were obtained. The length of the rod-like materials was about 2 m, and the diameter was about 60 mm. While sustaining the both ends, the rod-like material was locally heated by flame heating using propane gas, and twisted. Thus was performed the zone melting rotary stirring treatment. In this case, heating was performed as such that the temperature of the material should be about 2000° C. Thus, each of the transparent bodies free from striae in one direction was obtained by the zone melting rotary stirring treatment. The material obtained in Comparative Example 3 has the same composition, etc., as that obtained in Example 3, except that the zone melting rotary stirring treatment was not applied thereto.

Then, the transparent glass bodies were heated and molded into rod-like bodies each having a diameter of 300 mm and a length of about 70 mm. and were set inside an electric furnace. Thus, the rod-like bodies were held at 1150° C. for a duration of 20 hours, and were cooled at a cooling rate of 4° C./hr to 800° C., at which temperature the power source of the electric furnace was switched off and the bodies were allowed to cool naturally for the annealing treatment.

Subsequently, the transparent glass bodies were set inside the electric furnace equipped with a stainless steel jacket and a tungsten mesh heater. Thus, the bodies were doped with gaseous hydrogen under a pressurized 100% hydrogen atmosphere at 400° C. The pressure was changed to 1 kgf/cm$^2$ or 10 kgf/cm$^2$ (about 0,1 MPa to 1 MPa) to vary the content of dissolved hydrogen of each of the materials as shown in the Table.

Finally, the outer surface of the transparent glass bodies were cut to obtain cylindrical samples for the Examples and Comparative Examples, each 250 mm in diameter and 50 mm in length.

In Comparative Example 1, the sample was obtained by first synthesizing a white-colored soot body containing OH groups under the same conditions as those used in Example 1, followed by F-doping treatment free of OH groups, by performing a heat treatment in a 100% SiF4 gaseous atmosphere under a pressure of 1 kgf/cm$^2$ (about 0,1 MPa) and at a temperature of 1100° C. Rotary stirring treatment and hydrogen doping treatment were performed under the same conditions as those used in Examples 1 and 2.

In Comparative Example 2, the sample was obtained in the same manner as in Examples 3 and 4, except for not performing hydrogen gas doping treatment. The glass thus obtained contained no dissolved gaseous hydrogen.

In Comparative Example 3, the sample was obtained under the similar conditions as those of Comparative Example 2. except for not performing rotary stirring treatment.

In Comparative Example 4, the sample was obtained under the similar conditions as those of Comparative Example 2, except for not performing the F-doping treatment, but by doping the body with Cl under a 100% gaseous Cl atmosphere. The glass thus obtained contained 900 wtppm of Cl.

In Comparative Example 5, the sample was obtained under the similar conditions as those of the Examples, except for not performing the F-doping treatment. The glass thus obtained was found to contain 300 wtppm of OH groups.

The samples thus obtained in Examples and Comparative Examples were subjected to measurements to obtain the concentration of OH groups. the fluctuation in the concentration of OH groups ($\Delta OH$), the fluctuation in the concentration of F ($\Delta F$), the Cl concentration, the concentration of dissolved hydrogen, the fluctuation in the concentration of dissolved hydrogen ($\Delta H_2$), the concentration of oxygen deficient type defects, the fluctuation in refractive index ($\Delta n$), and the amount of strain, as well as the transmittance before and after irradiating radiation from a laser and a lamp, and the uniformity of the material after irradiating radiation from a laser and a lamp, i.e., the $\Delta n$ and the amount of strain, respectively. The results are given in the Tables.

The contents of impurities of the glass samples for Examples 1, 2, 4, 5, and Comparative Example 3 are given in Table 5.

The physical properties and the like of the samples for Examples and Comparative Examples were measured by the methods as follows.

(i) Measurement of the OH Group Concentration

The measurement was performed in accordance with the method described in D. M. Dodd and D. B. Fraser, "Optical determination of OH in fused silica", *Journal of Applied Physics*, Vol. 37(1966), p. 3911.

(ii) Measurement of the Fluctuation in Concentration of OH Groups and the Mean Value Thereof In a cylindrical silica glass optical material 250 mm in diameter and 50 mm in length, the concentration of OH groups was measured at 25 points at an interval of 10 mm along the direction of the diameter as observed from the direction of the symmetrical rotary axis.

The fluctuation in the concentration of OH groups ($\Delta OH$) for the entire optical material is obtained from the maximum and the minimum values of the OH concentration measured at 25 points. The mean concentration of the OH groups is calculated from the arithmetic mean of the 25 values of OH concentration thus obtained.

(iii) Measurement of the Concentration of Hydrogen Molecules

The measurement was performed in accordance with the method described in V. K. Khotimchenko et al., "Determining the content of hydrogen dissolved in quartz glass using the methods of Raman scattering and mass spectrometry", *Journal of Applied Spectroscopy*, Vol. 46, No. 6(1987). pp. 632–635.

(iv) Measurement of the Fluctuation in Concentration of Hydrogen Molecules and the Mean Value Thereof In a cylindrical silica glass optical material 250 mm in diameter and 50 mm in length, the concentration of $H_2$ was measured at 25 points at an interval of 10 mm along the direction of the diameter as observed from the direction of the symmetrical rotary axis. The fluctuation in the concentration of $H_2$ ($\Delta H_2$) for the entire optical material is obtained from the maximum and the minimum values of the $H_2$ concentration measured at 25 points. The mean concentration of $H_2$ is calculated from the arithmetic mean of the 25 values of $H_2$ concentration thus obtained.

(v) Measurement of the Concentration of Chlorine

The measurement was performed by decomposing the sample with an aqueous HF solution, and nephelometry was applied after adding $AgNO_3$ to the resulting solution.

(vi) Measurement of the Concentration of Fluorine

The measurement was performed by decomposing the sample with an aqueous NaOH solution, and the concentration of F was measured by means of ion electrode method.

(vii) Measurement of the Fluctuation in Concentration of Fluorine and the Mean Value Thereof In a cylindrical silica glass optical material 250 mm in diameter and 50 mm in length, the concentration of F was measured at 25 points at an interval of 10 mm along the direction of the diameter as observed from the direction of the symmetrical rotary axis. The fluctuation in the concentration of F ($\Delta F$) for the entire optical material is obtained from the maximum and the minimum values of the F concentration measured at 25 points. The mean concentration of F is calculated from the arithmetic mean of the 25 values of F concentration thus obtained.

(viii) Measurement of Impurities Contained in Silica Glass

Atomic absorption spectroscopy was used for Na, K, Mg, Ca, Fe, and induction coupled plasma mass spectroscopy (ICP-MS) method was used for Li, Cr, Ni, Mo, and W.

(ix) Measurement of the Fluctuation in Refractive Index ($\Delta n$)

Measurement was made by interference method using He—Ne laser (633 nm) as the light source. The value was taken in an area 230 mm in diameter.

(x) Measurement of Birefringence (Amount of Strain)

Retardation method was used by employing strain gauge equipped with polarizers. The value was taken in an area 230 mm in diameter.

(xi) Measurement of Transmittance for a Radiation with a Wavelength of 193 nm After Irradiation with ArF Excimer Laser Radiation To a sample $30 \times 20$ mm$^2$ in area and 10 mm in thickness having a mirror polished plane on both surfaces, a laser radiation with a wavelength of 193 nm was irradiated at a half width of 3 nm, a half pulse life width of 17 nsec, and an energy density of 30 mJ/cm$^2$/shot, at a frequency of 200 Hz and an irradiation repetition of $1 \times 10^6$ shots, and the transmittance was measured for a light with 193 nm wavelength 3 minutes after the irradiation.

(xii) Measurement of Transmittance for a Radiation with a Wavelength 172 nm After Irradiation with $Xe_2$ Excimer Lamp Radiation To a sample $30 \times 20$ mm$^2$ in area and 10 mm in thickness having a mirror polished plane on both surfaces, a radiation with a wavelength of 172 nm from a lamp was irradiated at a half width of 14 nm and a lamp energy density of 10 mW/cm$^2$ for a duration of 14 days, and the transmittance was measured for a light with a wavelength of 172 nm 3 minutes after the irradiation.

(xiii) Measurement of the Concentration of Oxygen Deficient Type Defects

Measurement was performed in accordance with the method described in H. Hosono et al., "Experimental evidence for the Si—Si bond model of the 7.6 eV band in $SiO_2$ glass", *Physical Review* B, Vol. 44, No. 21(1991), pp.12043–12045.

TABLE 1

| | (Examples) | | |
|---|---|---|---|
| | Example 1 | Example 2 | Example 3 |
| Sample size (diameter × thickness) (mm) | 250 × 50 | 250 × 50 | 250 × 50 |
| Mean concentration of OH groups (a) (wtppm) | 5 | 10 | 20 |
| $\Delta$OH (wtppm) | $\leq 1$ | $\leq 1$ | 2 |
| Mean concentration of F (b) (wtppm) | 1500 | 1300 | 900 |
| a + b | 1505 | 1310 | 920 |
| b/a | 300 | 130 | 45 |
| $\Delta$F (wtppm) | 50 | 30 | 20 |
| Cl concentration (wtppm) | <10 | <10 | <10 |
| Mean concentration of $H_2$ (molecules/cm$^3$) | $3 \times 10^{17}$ | $3 \times 10^{17}$ | $3 \times 10^{17}$ |
| $\Delta H_2$ (molecules/cm$^3$) | $<5 \times 10^{16}$ | $<5 \times 10^{16}$ | $<5 \times 10^{16}$ |
| Density of oxygen deficient defects (defects/cm$^3$) | $<1 \times 10^{17}$ | $<1 \times 10^{17}$ | $<1 \times 10^{17}$ |
| Fluctuation in refractive index $\Delta n$ | $3 \times 10^{-6}$ | $2 \times 10^{-6}$ | $5 \times 10^{-7}$ |
| strain (nm/cm) | <1 | <1 | <1 |
| Irradiation using ArF laser | | | |
| Transmittance before irradiation (%) | 90 | 90 | 90 |
| Transmittance after irradiation (%) | 88 | 89 | 90 |
| Irradiation using $Xe_2$ lamp | | | |
| Transmittance before irradiation (%) | 88 | 88 | 88 |
| Transmittance after irradiation (%) | 86 | 88 | 88 |
| Note | | | |

TABLE 2

| | (Examples) | | |
|---|---|---|---|
| No. Experiments | Example 4 | Example 5 | Example 6 |
| Sample size (diameter × thickness) (mm) | 250 × 50 | 250 × 50 | 250 × 50 |
| Mean concentration of OH groups (a) (wtppm) | 20 | 50 | 100 |
| $\Delta$OH (wtppm) | 2 | 5 | 10 |
| Mean concentration of F (b) (wtppm) | 900 | 300 | 200 |
| a + b | 920 | 350 | 300 |
| b/a | 45 | 6 | 2 |
| $\Delta$F (wtppm) | 20 | 10 | 5 |
| Cl concentration (wtppm) | <10 | <10 | <10 |
| Mean concentration of $H_2$ (molecules/cm$^3$) | $3 \times 10^{17}$ | $3 \times 10^{17}$ | $3 \times 10^{17}$ |
| $\Delta H_2$ (molecules/cm$^3$) | $2 \times 10^{17}$ | $<5 \times 10^{16}$ | $<5 \times 10^{16}$ |

TABLE 2-continued (Examples)

| No. Experiments | Example 4 | Example 5 | Example 6 |
|---|---|---|---|
| Density of oxygen deficient defects (defects/cm$^3$) | $<1 \times 10^{17}$ | $<1 \times 10^{17}$ | $<1 \times 10^{17}$ |
| Fluctuation in refractive index Δn | $7 \times 10^{-7}$ | $4 \times 10^{-7}$ | $1 \times 10^{-6}$ |
| strain (nm/cm) | <1 | <1 | <1 |
| Irradiation using AfF laser | | | |
| Transmittance before irradiation (%) | 90 | 90 | 90 |
| Transmittance after irradiation (%) | 90 | 90 | 89 |
| Irradiation using Xe$_2$ lamp | | | |
| Transmittance before irradiation (%) | 88 | 87 | 85 |
| Transmittance after irradiation (%) | 88 | 86 | 83 |
| Note | | | |

TABLE 3

(Comparative Examples)

| No. Experiments | Comp. Ex. 1 | Comp. Ex. 2 | Comp. Ex. 3 | Comp. Ex. 4 |
|---|---|---|---|---|
| Sample size (diameter × thickness) (mm) | 250 × 50 | 250 × 50 | 250 × 50 | 250 × 50 |
| Mean concentration of OH groups (a) (wtppm) | <1 | 20 | 20 | 20 |
| ΔOH (wtppm) | <1 | 2 | 10 | 2 |
| Mean concentration of F (b) (wtppm) | 1600 | 900 | 900 | <10 |
| a + b | 1600 | 920 | 920 | <30 |
| b/a | >1000 | 45 | 45 | <0.5 |
| ΔF (wtppm) | 100 | 20 | 300 | <10 |
| Cl concentration (wtppm) | <10 | <10 | <10 | 900 |
| Mean concentration of H$_2$ (molecules/cm$^3$) | $3 \times 10^{17}$ | $<5 \times 10^{15}$ | $3 \times 10^{17}$ | $3 \times 10^{17}$ |
| ΔH$_2$ (molecules/cm$^3$) | $<5 \times 10^{16}$ | $<5 \times 10^{16}$ | $5 \times 10^{17}$ | $<5 \times 10^{16}$ |
| Density of oxygen deficient defects (defects/cm$^3$) | $1 \times 10^{16}$ | $<1 \times 10^{17}$ | $<1 \times 10^{17}$ | $<1 \times 10^{17}$ |
| Fluctuation in refractive index Δn | $4 \times 10^{-6}$ | $1 \times 10^{-6}$ | $8 \times 10^{-6}$ | $1 \times 10^{-6}$ |
| strain (nm/cm) | 1 | <1 | 5 | <1 |
| Irradiation using ArF laser | | | | |
| Transmittance before irradiation (%) | 90 | 90 | 90 | 90 |
| Transmittance after irradiation (%) | 75 | 60 | 88–80 | 78 |
| Irradiation using Xe$_2$ lamp | | | | |
| Transmittance before irradiation (%) | <5 | 88 | 88 | 88 |
| Transmittance after irradiation (%) | <5 | 54 | 85–80 | 64 |
| Note | F doped, OH group free | Hydrogen molecule free | Without rotary stirring | F free, Cl doped |

TABLE 4

(Comparative Examples)

| No. Experiments | Comp. Ex. 5 | Comp. Ex. 6 | Comp. Ex. 7 |
|---|---|---|---|
| Sample size (diameter × thickness) (mm) | 250 × 50 | 250 × 50 | 250 × 50 |
| Mean concentration of OH groups (a) (wtppm) | 300 | 5 | 120 |
| ΔOH (wtppm) | 30 | ≦1 | 10 |
| Mean concentration of F (b) (wtppm) | <10 | 50 | 40 |
| a + b | 300 | 55 | 160 |
| b/a | 0 | 10 | 0.3 |
| ΔF (wtppm) | <10 | <10 | <10 |
| Cl concentration (wtppm) | <10 | <10 | <10 |
| Mean concentration of H$_2$ (molecules/cm$^3$) | $3 \times 10^{17}$ | $3 \times 0\, 10^{17}$ | $3 \times 0\, 10^{17}$ |
| ΔH$_2$ (molecules/cm$^3$) | $2 \times 10^{17}$ | $<5 \times 10^{16}$ | $<5 \times 10^{16}$ |
| Density of oxygen deficient defects (defects/cm$^3$) | $<1 \times 10^{17}$ | $<1 \times 10^{17}$ | $<1 \times 10^{17}$ |
| Fluctuation in refractive index Δn | $2 \times 10^{-6}$ | $3 \times 10^{-6}$ | $2 \times 10^{-6}$ |
| strain (nm/cm) | <1 | 5 | 3 |
| Irradiation using AfF laser | | | |
| Transmittance before irradiation (%) | 89 | 90 | 90 |
| Transmittance after irradiation (%) | 88 | 80 | 85 |
| Irradiation using Xe$_2$ lamp | | | |
| Transmittance before irradiation (%) | 82 | 88 | 84 |
| Transmittance after irradiation (%) | 62 | 78 | 73 |
| Note | F free, OH groups doped | a + b >100 | b/a < 1 |

TABLE 5

(Analysis of Impurities)

| Element | Example 1 | Example 2 | Example 4 | Example 5 | Comp. Ex. 3 |
|---|---|---|---|---|---|
| Li | 2 | 1 | 1 | 1 | 1 |
| Na | 4 | 3 | 4 | 3 | 4 |
| K | 3 | 2 | 2 | 1 | 2 |
| Ca | 1 | 1 | 1 | 0.1 | 0.1 |
| Mg | <0.1 | <0.1 | 0.5 | <0.1 | <0.1 |
| Cr | <0.1 | <0.1 | <0.1 | <0.1 | <0.1 |
| Fe | 0.1 | <0.1 | <0.1 | <0.1 | <0.1 |
| Ni | <0.1 | <0.1 | <0.1 | <0.1 | <0.1 |
| Mo | 0.1 | 0.1 | <0.1 | <0.1 | <0.1 |
| W | 0.1 | 0.1 | <0.1 | <0.1 | <0.1 |

It can be seen clearly from the Table that the Examples 2, 3, and 4 are particularly superior in resistance against ArF excimer laser radiation; furthermore, these Examples 2, 3, and 4 show superior resistance against a radiation irradiated from $Xe_2$ lamp.

The glass obtained in Examples 1 to 6 showed high uniformity even after irradiation with an excimer laser radiation, which can be seen from the A/n value of $3 \times 10^{-6}$ or smaller and a strain of 1 nm/cm or smaller.

On the other hand, the glass obtained in Comparative Example 1 was free of OH groups but contained 1600 wtppm of F. Thus, the glass was found to have inferior resistance against excimer laser radiations, because it decomposed during the application of various types of heat treatment and generated gaseous $F_2$, and resulted in the generation of oxygen deficient type defects exhibiting a 7.6 eV absorption band.

The glass obtained in Comparative Example 2 was free of dissolved gaseous hydrogen, and showed inferior resistance against excimer laser radiation.

In the glass of Comparative Example 3, zone melting rotary stirring treatment was not applied. Accordingly, the glass showed relatively high values for ΔOH, ΔF, and $ΔH_2$. Furthermore, the value of Δn was also found to be large. The resistance against excimer laser radiation was found to vary from portion to portion of the glass.

In Comparative Example 4, the glass is free of fluorine, but contains 900 wtppm of Cl. Thus, the light transmittance thereof was severely impaired.

In Comparative Example 5, the glass is free of F and Cl, but contains OH groups to excess such as 300 wtppm. Accordingly, the ultraviolet absorption edge was found to shift to the longer wavelength side, and showed inferior resistance against excimer laser radiation.

In Comparative Example 6, the value a+b showed an insufficiently low value of 55 wtppm. Thus, the glass showed poor resistance against excimer laser radiation, and had a large strain.

The glass obtained in Comparative Example 7 yielded an extremely low b/a value of 0.3. Thus, it showed particularly low resistance against radiation from $Xe_2$ lamp.

The effects of the silica glass optical material according to the present invention can be clearly understood from the above facts.

What is claimed is:

1. A silica glass optical material for transmitting light with a wavelength of from 155 to 195 nm emitted from an excimer laser or an excimer lamp, which comprises silica glass optical material of ultrahigh purity, containing from 1 to 100 wtppm of OH groups, from $5 \times 10^{16}$ to $5 \times 10^{19}$ molecules/cm$^3$ of $H_2$, and from 10 to 10,000 wtppm of F, but substantially free from halogens other than F, and having a fluctuation in refractive index, Δn, of from $3 \times 10^{-6}$ to $3 \times 10^{-7}$.

2. A silica glass optical material as claimed in claim 1, wherein the material is of ultrahigh purity containing, as impurities, a maximum of 5 wtppb of each of Li, Na, and K, 1 wtppb or less of each of Ca and Mg, and 0.1 wtppb of each of Cr, Fe, Ni, Mo, and W.

3. A silica glass optical material as claimed in claim 1, wherein the concentration of oxygen-deficient type defects which generate an absorption band at 7.6 eV is $1 \times 10^{17}$ defects/cm$^3$ or less.

4. A silica glass optical material as claimed in claim 1, wherein the material contains 10 wtppm or less of Cl.

5. A silica glass optical material as claimed in claim 1, wherein the material is used for an optical device having an optical path length from an excimer laser or an excimer lamp of 30 mm or longer.

6. A silica glass optical material as claimed in claim 1, wherein the material contains from 10 to 380 wtppm of F.

7. A silica glass optical material as claimed in claim 6, wherein the material is used for an optical device having an optical path length from an excimer laser or an excimer lamp of 30 mm or longer.

8. A silica glass optical material as claimed in claim 1, wherein the material contains from 12 to 100 wtppm of OH groups and from $3 \times 10^{17}$ to $1 \times 10^{19}$ molecules/cm$^3$ of $H_2$.

9. A silica glass optical material as claimed in claim 8, wherein the material is of ultrahigh purity containing, as impurities, a maximum of 5 wtppb of each of Li, Na, and K, 1 wtppb or less of each of Ca and Mg, and 0.1 wtppb of each of Cr, Fe, Ni, Mo, and W.

10. A silica glass optical material as claimed in claim 8, wherein the concentration of oxygen-deficient type defects which generate an absorption band at 7.6 eV is $1 \times 10^{17}$ defects/cm$^3$ or less.

11. A silica glass optical material as claimed in claim 8, wherein the material contains 10 wtppm or less of Cl.

12. A silica glass optical material as claimed in claim 8, wherein the material is used for an optical device having an optical path length from an excimer laser or an excimer lamp of 30 mm or longer.

13. A silica glass optical material as claimed in claim 1, wherein the fluctuation in $H_2$ concentration, $ΔH_2$, is $3 \times 10^{17}$ motecules/cm$^3$ or less.

14. A silica glass optical material as claimed in claim 13, wherein the material contains from 10 to 380 wtppm of F.

15. A silica glass optical material as claimed in claim 3, wherein the material is of ultrahigh purity containing, as impurities, a maximum of 5 wtppb of each of Li, Na, and K, 1 wtppb or less of each of Ca and Mg, and 0.1 wtppb of each of Cr, Fe, Ni, Mo, and W.

16. A silica glass optical material as claimed in claim 13, wherein the concentration of oxygen-deficient type defects which generate an absorption band at 7.6 eV is $1 \times 10^{17}$ defects/cm$^3$ or less.

17. A silica glass optical material as claimed in claim 13, wherein the material contains 10 wtppm or less of Cl.

18. A silica glass optical material as claimed in claim 13, wherein the material is used for an optical device having an optical path length from an excimer laser or an excimer lamp of 30 mm or longer.

19. A silica glass optical material as claimed in claim 13, wherein the material contains from 12 to 100 wtppm of OH groups and from $3 \times 10^{17}$ to $1 \times 10^{19}$ molecules/cm$^3$ of $H_2$.

20. A silica glass optical material as claimed in claim 19, wherein the material contains 1 wtppm or less of Cl.

21. A silica glass optical material as claimed in claim 19, herein the material is used for an optical device having an optical path length from an excimer laser or an excimer lamp of 30 mm or longer.

22. A silica glass optical material as claimed in claim 1, wherein the fluctuation in OH-group concentration, ΔOH, is 30 wtppm or less.

23. A silica glass optical material as claimed in claim 22, wherein the material contains from 10 to 380 wtppm of F.

24. A silica glass optical material as claimed in claim 22, wherein the material is of ultrahigh purity containing, as impurities, a maximum of 5 wtppb of each of Li, Na, and K, 1 wtppb or less of each of Ca and Mg, and 0.1 wtppb of each of Cr, Fe, Ni, Mo, and W.

25. A silica glass optical material as claimed in claim 22, wherein the concentration of oxygen-deficient type defects which generate an absorption band at 7.6 eV is $1 \times 10^{17}$ defects/cm$^3$ or less.

26. A silica glass optical material as claimed in claim 23, wherein the material contains 10 wtppm or less of Cl.

27. A silica glass optical material as claimed in claim 22, wherein the material is used for an optical device having an optical path length from an excimer laser or an excimer lamp of 30 mm or longer.

28. A silica glass optical material as claimed in claim 2, wherein the material contains from 12 to 100 wtppm of OH groups and from $3 \times 10^{17}$ to $1 \times 10^{19}$ molecules/cm$^3$ of $H_2$.

29. A silica glass optical material as claimed in claim 28, wherein the concentration of oxygen-deficient type defects which generate an absorption band at 7.6 eV is $1 \times 10^{17}$ defects/cm$^3$ or less.

30. A silica glass optical material as claimed in claim 28, wherein the material contains 10 wtppm or less of Cl.

31. A silica glass optical material as claimed in claim 28, wherein the material is used for an optical device having an optical path length from an excimer laser or an excimer lamp of 30 mm or longer.

32. A silica glass optical material as claimed in claim 2, wherein the fluctuation in $H_2$ concentration, $\Delta H_2$, is $3 \times 10^{17}$ molecules/cm$^3$ or less.

33. A silica glass optical material as claimed in claim 32, wherein the material contains from 10 to 380 wtppm of F.

34. A silica glass optical material as claimed in claim 32, wherein the material is of ultrahigh purity containing, as impurities, a maximum of 5 wtppb of each of Li, Na, and K, 1 wtppb or less of each of Ca and Mg, and 0.1 wtppb of each of Cr, Fe, Ni, Mo, and W.

35. A silica glass optical material as claimed in claim 32, wherein the concentration of oxygen-deficient type defects which generate an absorption band at 7.6 eV is $1 \times 10^{17}$ defects/cm$^3$ or less.

36. A silica glass optical material as claimed in claim 3, wherein the material contains 10 wtppm or less of Cl.

37. A silica glass optical material as claimed in claim 32, wherein the material is used for an optical device having an optical path length from an excimer laser or an excimer lamp of 30 mm or longer.

* * * * *